United States Patent [19]
Peltzer

[11] Patent Number: 6,093,620
[45] Date of Patent: Jul. 25, 2000

[54] METHOD OF FABRICATING INTEGRATED CIRCUITS WITH OXIDIZED ISOLATION

[75] Inventor: Douglas L. Peltzer, Cupertino, Calif.

[73] Assignee: National Semiconductor Corporation, Santa Clara, Calif.

[21] Appl. No.: 07/396,733

[22] Filed: Aug. 18, 1989

Related U.S. Application Data

[60] Continuation of application No. 05/187,124, Oct. 6, 1971, abandoned, which is a division of application No. 05/111,956, Feb. 2, 1971, Pat. No. 3,648,125.

[51] Int. Cl.$^7$ .................................................... H01L 21/76
[52] U.S. Cl. ...................... 438/416; 438/414; 438/444; 438/356; 438/357; 438/359
[58] Field of Search .................... 437/64, 69, 70, 437/72, 158, 67; 148/DIG. 26, 50, 85, 117; 357/48, 49, 50

[56] References Cited

U.S. PATENT DOCUMENTS

| Re. 28,653 | 12/1975 | Murphy | 148/DIG. 117 |
|---|---|---|---|
| 2,981,877 | 4/1961 | Noyce . | |
| 3,025,589 | 3/1962 | Hoerni | 29/25.3 |
| 3,064,167 | 11/1962 | Hoerni . | |
| 3,117,260 | 1/1964 | Noyce | 317/235 |

(List continued on next page.)

FOREIGN PATENT DOCUMENTS

| 704674 | 10/1967 | Belgium . |
|---|---|---|
| 8631139 | 1/1971 | Canada . |
| 932475 | 8/1973 | Canada . |
| 1549386 | 12/1968 | France . |
| 7125298 | 10/1972 | France . |

(List continued on next page.)

OTHER PUBLICATIONS

Agusta et al., "Component Interconnection for Integrated Circuits," *IBM Technical Disclosure Bulletin*, vol. 8, No. 12, May 1966, pp. 1843–1844.

Appels et al., "Local Oxidation of Silicon and Its Application in Semiconductor–Device Technology," *Philips Research Reports*, vol. 25, 1970, pp. 118–132.

Baker et al., "Oxide Isolation Brings High Density to Production Bipolar Memories," *Electronics*, Mar. 1973, pp. 65–70.

Bhola et al., "Epitaxial Deposition of Silicon by Thermal Decomposition of Silane," *RCA Review*, Dec. 1963, pp. 511–522.

Burger et al., *Fundamentals of Silicon Integrated Device Technology, vol. 1, Oxidation, Diffusion and Epitaxy* (Prentice Hall Inc.), 1967.

Doo et al., "Making Monolithic . . . Insulation and Junction Isolation Technology," *IBM Technical Disclosure Bulletin*, vol. 8, No. 4, Sep. 1965, pp. 659–660.

Jones et al., "A Composite Insulator–Junction Isolation," *Electrochemical Technology*, vol. 5, No. 5–6, May, Jun. 1967, pp. 308–310.

Kooi et al., LOCOS Devices, *Philips Research Reports*, vol. 26, Mar. 1971, pp. 166–180.

Kooi et al., "Locos Techniek voor Bipolaire Transistors," *Philips Technisch Tijdschrift*, vol. 31, No. 11/12, 1970, p. 381.

Maheux, "Transistors for Monolithic Circuits," *IBM Technical Disclosure Bulletin*, vol. 11, No. 12, May 1969, pp. 1690–1691.

Murphy et al., "Collector Diffusion Isolated Integrated Circuits," *Proceedings of the IEEE*, vol. 57, No. 9, 1969, pp. 1523–1527.

"Process Cuts IC Cost," *Electro Technology*, Feb. 1970, p. 11.

*Primary Examiner*—Trung Dang
*Attorney, Agent, or Firm*—Skjerven, Morrill, MacPherson, Franklin & Friel LLP

[57] ABSTRACT

A thin silicon epitaxial layer, formed on a silicon substrate, is subdivided into electrically isolated pockets by a grid of oxidized regions of epitaxial silicon material which extend through the epitaxial layer to a laterally extending PN junction.

17 Claims, 5 Drawing Sheets

U.S. PATENT DOCUMENTS

| | | | |
|---|---|---|---|
| 3,136,897 | 6/1964 | Kaufman | 307/88.5 |
| 3,150,299 | 9/1964 | Noyce . | |
| 3,156,591 | 11/1964 | Hale et al. | 148/175 |
| 3,189,798 | 6/1965 | Benjamin | 317/234 |
| 3,210,620 | 10/1965 | Lin | 317/234 |
| 3,210,677 | 10/1965 | Lin et al. | 330/17 |
| 3,241,010 | 3/1966 | Eddelston | 317/234 |
| 3,260,902 | 7/1966 | Porter . | |
| 3,290,753 | 12/1966 | Chang | 29/25.3 |
| 3,296,040 | 1/1967 | Wigton | 148/175 |
| 3,341,755 | 9/1967 | Husher et al. | 317/235 |
| 3,370,995 | 2/1968 | Lowery et al. | 148/175 |
| 3,386,865 | 6/1968 | Doo | 437/67 |
| 3,391,023 | 7/1968 | Fresura . | |
| 3,404,450 | 10/1968 | Karcher | 148/DIG. 85 |
| 3,404,451 | 10/1968 | So . | |
| 3,442,011 | 5/1969 | Strieter | 29/578 |
| 3,474,308 | 10/1969 | Kronlage | 317/235 |
| 3,488,564 | 1/1970 | Crafts | 317/235 |
| 3,489,961 | 1/1970 | Frescura et al. | 317/235 |
| 3,500,139 | 3/1970 | Frouin | 437/67 |
| 3,506,502 | 4/1970 | Nakamura | 148/174 |
| 3,510,735 | 5/1970 | Potter | 317/235 |
| 3,511,702 | 5/1970 | Jackson, Jr. et al. | 117/212 |
| 3,513,364 | 5/1970 | Heiman | 317/235 |
| 3,514,846 | 6/1970 | Lynch | 29/572 |
| 3,534,234 | 10/1970 | Clevenger | 437/60 |
| 3,550,292 | 12/1970 | Irie et al. | 148/1.5 |
| 3,575,740 | 4/1971 | Castrucci et al. | 148/175 |
| 3,575,741 | 4/1971 | Murphy | 148/DIG. 85 |
| 3,576,683 | 4/1971 | Matsubara | 148/175 |
| 3,596,149 | 7/1971 | Makimoto | 148/DIG. 85 |
| 3,598,664 | 8/1971 | Kilby | 148/175 |
| 3,602,981 | 9/1971 | Kooi | 29/571 |
| 3,602,982 | 9/1971 | Kooi | 148/DIG. 117 |
| 3,615,929 | 10/1971 | Portnoy | 148/175 |
| 3,640,806 | 2/1972 | Watanabe et al. | 148/175 UX |
| 3,649,386 | 3/1972 | Murphy | 437/66 |
| 3,736,193 | 5/1973 | Tucker et al. | 148/175 |
| 3,858,231 | 12/1974 | Magdo et al. | 357/15 |
| 3,861,968 | 1/1975 | Magdo et al. | 148/175 |
| 4,118,728 | 10/1978 | Berry | 357/22 |

FOREIGN PATENT DOCUMENTS

| | | |
|---|---|---|
| 2133976 | 1/1972 | Germany . |
| 633118 | 7/1971 | Japan . |
| 636627 | 8/1971 | Japan . |
| 6614016 | 10/1966 | Netherlands . |
| 7011252 | 7/1969 | Netherlands . |
| 6917558 | 5/1970 | Netherlands . |
| 7010204 | 7/1970 | Netherlands . |
| 7013365 | 9/1970 | Netherlands . |
| 1208576 | 10/1970 | United Kingdom . |
| 1330790 | 9/1973 | United Kingdom . |

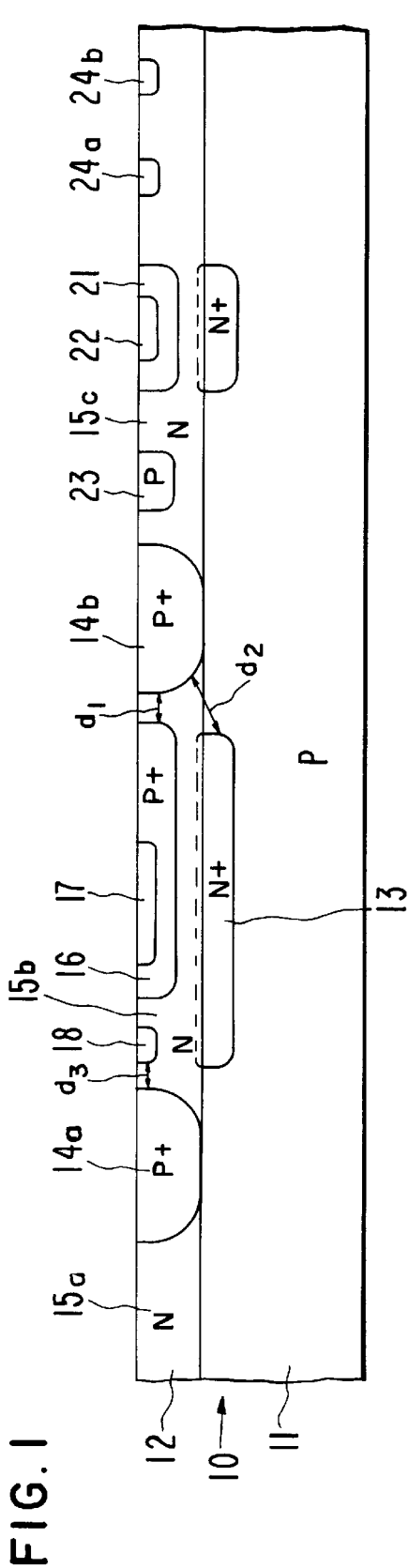
FIG. 1
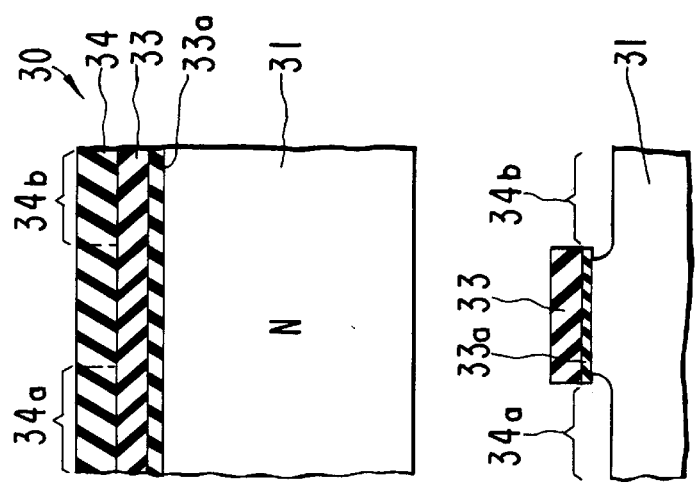
FIG. 3a
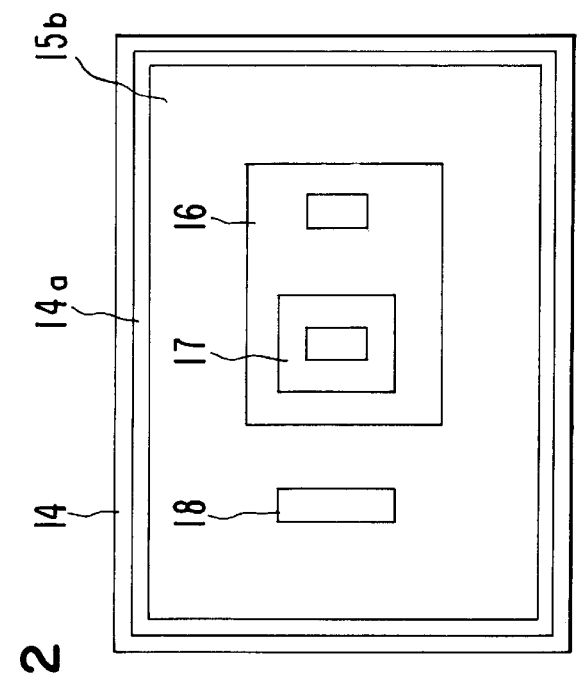
FIG. 2
FIG. 3b

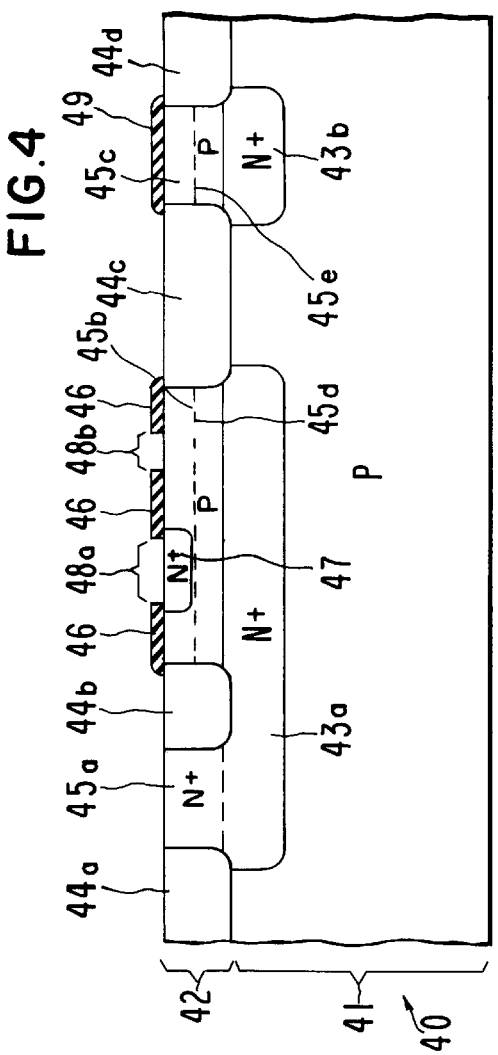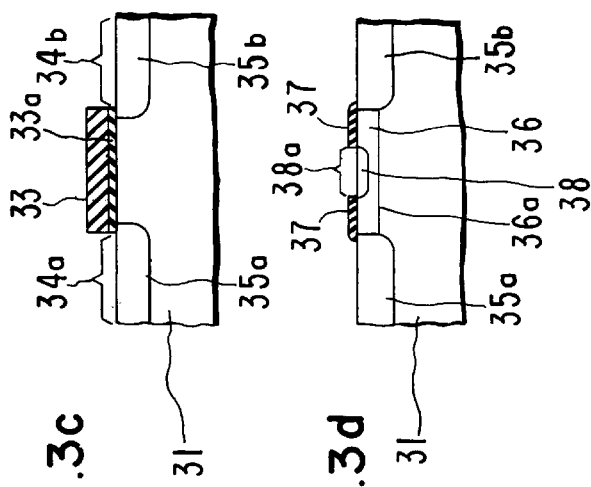

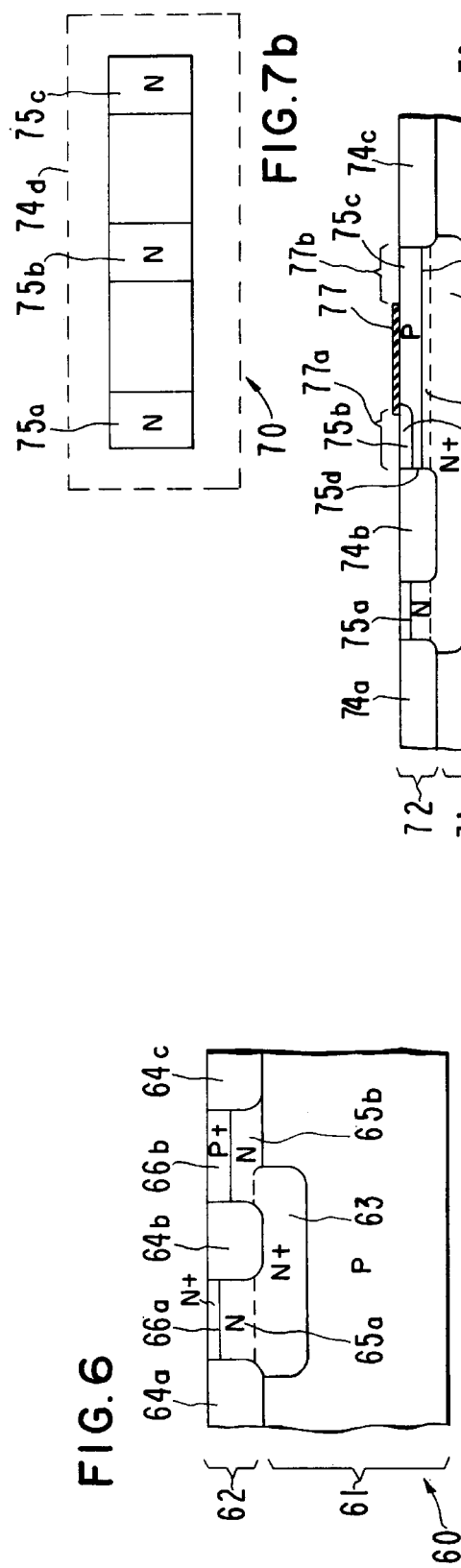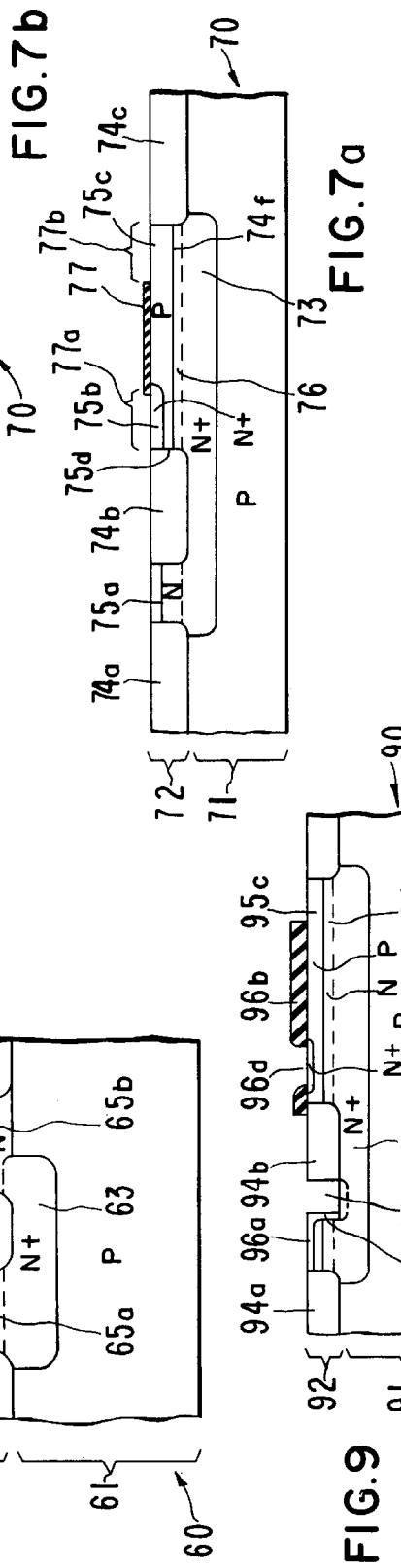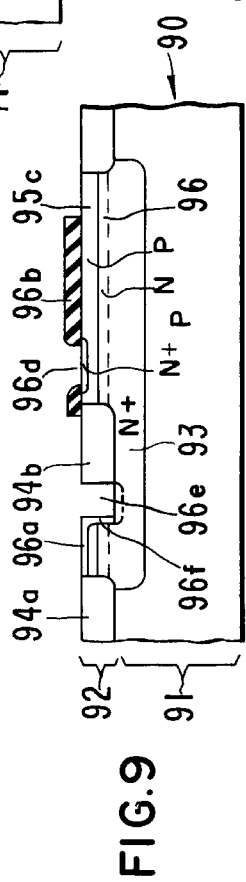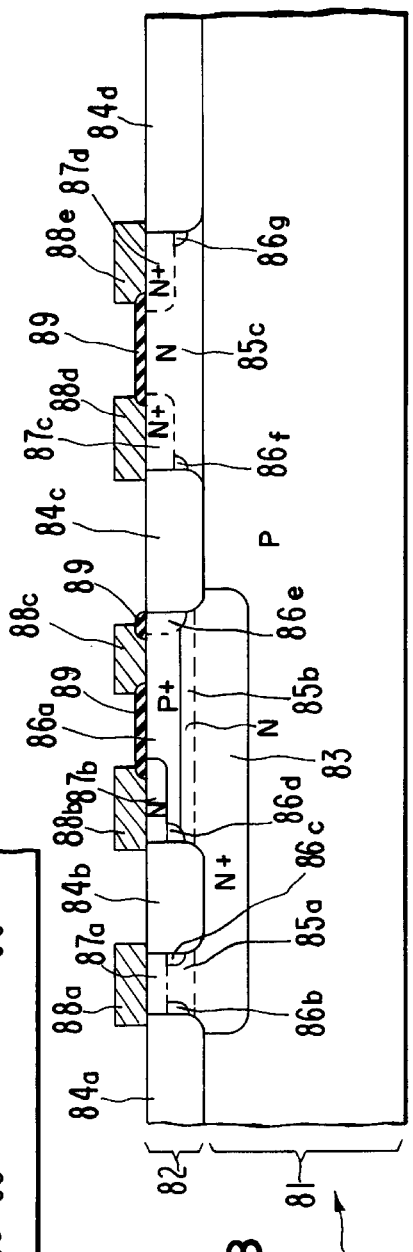

METHOD OF FABRICATING INTEGRATED CIRCUITS WITH OXIDIZED ISOLATION

CROSS-REFERENCE TO RELATED APPLICATION

This application is a continuation of application Ser. No. 05/187,124, filed Oct. 6, 1971, abandoned, which application is a division of U.S. application Ser. No. 05/111,956 filed Feb. 2, 1971 now U.S. Pat. No. 3,648,125 issued Mar. 7, 1972.

BACKGROUND OF THE INVENTION

1. Field of the Invention

This invention relates to semiconductor devices and in particular to integrated circuits of smaller size, higher speed and higher packing density than heretofore obtained, and to the process of making them.

2. Prior Art

Various ways have been proposed to isolate electrically a plurality of pockets of semiconductor material in each of which one or more circuit elements can be formed. Among the ways proposed have been appropriately biased PN junctions (Noyce U.S. Pat. No. 3,117,260 issued Jan. 7, 1964), combinations of PN junctions and zones of intrinsic and extrinsic semiconducting materials (Noyce U.S. Pat. No. 3,150,299 issued Sep. 22, 1964), dielectric isolation (Frescura U.S. Pat. No. 3,391,023 issued Jul. 2, 1968) and mesa etching (Frescura et al U.S. Pat. No. 3,489,961 issued Jan. 13, 1970). Tucker and Barry, in patent application Ser. No. 845,822 filed Jul. 29, 1969, disclose the use of selectively-doped polycrystalline silicon to help isolate islands of single crystal silicon in which circuit elements can be formed.

After electrically-isolated pockets of semiconductor material are prepared, active and passive circuit elements are formed within or on the pockets. Many of these circuit elements are typically formed using the planar diffusion techniques disclosed by Hoerni in U.S. Pat. Nos. 3,025,589 and 3,064,167. In the planar process, the regions of each semiconductor pocket into which circuit elements are diffused are controlled by forming a diffusion mask from an insulation layer formed on the surface of the semiconductor material. After the desired elements have been formed in the semiconductor material, a conductive lead pattern is formed on the insulation and used to interconnect selected active and passive circuit elements into the desired circuit. Additional passive circuit elements can also be formed on the insulation and interconnected into the circuit. Such a structure is disclosed in Noyce U.S. Pat. No. 2,981,877 issued Apr. 25, 1961.

In the manufacture of integrated circuits, several problems arise. First, the area of the wafer required for the placement of the isolation regions between adjacent pockets of semiconductor material is a significant portion of the total wafer area. A large isolation area reduces the number of devices which can be placed in a wafer and thus lowers the "packing density" of the circuit elements formed in the wafer. Second, the leads formed on, and adherent to, the insulation on the wafer surface sometimes crack at steps in the insulation on the wafer surface. These steps are often quite steep. Third, several of the isolation techniques result in significant capacitances being introduced into the integrated circuit. While at low frequencies these capacitances do not affect the operation of the circuit, at high frequencies these capacitances can have a significant effect on circuit performance. Fourth, the prior art integrated circuits are usually formed in relatively thick (greater than 5 microns) epitaxial layers formed on support substrates. As a result, the operating speeds of the resulting devices are sometimes slower than desired. Fifth, the processes by which prior art integrated circuits are produced are relatively sensitive to defects in masks and to small errors in the sequential placement of masks on the device during the various process steps. Low defect masks, low defect masking procedures and proper alignment of the masks are important factors in obtaining good yields.

To eliminate cracks in the interconnect leads at steps in the insulation, J. S. So, in U.S. Pat. No. 3,404,451 issued Oct. 8, 1968 proposes to remove portions of this insulation from the wafer surface during processing. It has also been proposed to slope the edges of the insulation at the contact window. A different approach, disclosed by J. A. Appels, et al in an article entitled "Local Oxidation of Silicon and its Application in Semiconductor-Device Technology" Philips Research Reports 25, page 118 (1970), is to etch grooves into the semiconductor wafer adjacent those regions in which PN junctions are to be formed. The material exposed by the grooves is then thermally oxidized. If the process is properly controlled, the oxide surface and the surface of the semiconductor material approximately coplanar. An added advantage of this process, emphasized by Appels et al, is that the portion of the semiconductor wafer in which the impurity is diffused has a mesa-like shape. The resulting PN base-collector junction is substantially flat and has a higher breakdown voltage than does a dish-shaped PN junction but still contacts passivating oxide, as in the planar process.

SUMMARY OF THE INVENTION

A thin silicon epitaxial layer, formed on a silicon substrate, is subdivided into electrically-isolated pockets by a grid of oxidized regions of epitaxial silicon material (hereafter called "oxidized isolation regions"). These regions are oxidized through the epitaxial layer to a laterally-extending isolation PN junction (hereafter called the "isolation PN junction").

At least one side of this isolation PN junction has a resistivity and conductivity type determined by dopants from the substrate. Usually this junction is not coextensive with the metallurgical interface between the epitaxial silicon layer and the underlying silicon substrate. Rather, during the formation of the epitaxial layer, the position of the isolation PN junction is determined by dopant concentrations, diffusion constants, and process parameters. Its ultimate position is also influenced by the subsequent processing of the wafer.

The isolation PN junction may be made up of a series of PN junctions including PN junctions between buried layers in the substrate and the substrate itself. The isolation PN junction defines a surface which may extend into both the epitaxial layer and the substrate. Each pocket of silicon is isolated by a portion of the isolation PN junction and portions of the oxidized isolation regions.

Each such pocket can contain active devices, passive devices or both. Cross-under regions of low resistivity can be formed in the substrate to interconnect regions separated by at least one oxidized isolation region. The top surfaces of the epitaxial layer and the oxidized isolation regions are substantially coplanar, thereby reducing undesirable elevation variances or "steps" between the isolation oxide and other portions of the wafer surface.

To form isolated pockets of epitaxial silicon, grooves (sometimes called depressions) are formed in the silicon where isolation regions are to be formed. During groove formation, the remainder of the silicon surface where grooves are not desired is protected by an insulation layer which is substantially unaffected by the silicon etch used to form the grooves. The grooves are etched in a conventional way to a depth of about 50 percent of the desired depth of the oxidized isolation regions. The epitaxial silicon exposed by the grooves is oxidized down to the under lying isolation PN junction. When the isolation PN junction lies in the substrate, the oxidation process continues into the substrate so that the oxidized isolation regions penetrate into the substrate to intersect the appropriate portions of the isolation PN junction. Silicon nitride is a convenient insulation to protect underlying silicon from oxidation.

Several different combinations of epitaxial layers and substrates are possible. If the substrate is of one type conductivity (either P-type or N-type), then an epitaxial layer of opposite type conductivity can be grown directly upon the substrate. In addition, buried layers of opposite type conductivity can be formed in the top surface of the substrate and then an epitaxial layer of either type conductivity can be formed on the substrate over the buried layers. In each of these situations, however, the oxidized isolation regions must extend down to the isolation PN junction.

In one embodiment of this invention, only three diffusion masking steps are required, one to form the buried layer, one to form the oxidized isolation regions and the third to form the emitter regions and the collector sinks in the resulting device. The base mask is eliminated and an unmasked "sheet" diffusion is used. The contact mask alignment is simplified relative to prior art processes because the electrical contacts can be formed abutting portions of the oxide isolation region without danger of short circuit The above-described invention overcomes a substantial number of disadvantages of prior art integrated circuit structures and provides a simplified, improved, and more reliable technique for their manufacture.

The electrically isolated transistors in integrated circuits fabricated according to this invention are more than 65% smaller than comparable transistors isolated using prior art diffusion isolation techniques. Contrary to normal expectations, despite this size reduction, yields are significantly improved.

A major portion of the silicon surface area of a representative integrated circuit made according to this invention is not occupied by the circuit elements themselves, but is occupied by the oxidized isolation regions. Any defect in the masks used to make the circuit will, therefore, have a very high probability of overlying these isolation regions and not the circuit elements. A mask defect which falls over such an isolation region has absolutely no detrimental effect on the operation of the circuit and is thus rendered harmless. Since mask defects are a major source of integrated circuit yield loss, this neutralization of mask defects in the invented process enormously increases integrated circuit yields.

Finally, the use of the oxidized isolation regions of this invention decreases unwanted capacitances between adjacent semiconductor pockets and increases the allowable tolerances with which masks must be aligned. Indeed, in some cases, an entire masking step can be eliminated.

DESCRIPTION OF THE DRAWINGS

FIG. 1 shows in cross-section a typical diffusion isolated integrated circuit of the prior art;

FIG. 2 shows a top view of a portion of the circuit shown in FIG. 1;

FIGS. 3a through 3d illustrate the selective oxidation process disclosed by Appels et al in the article referred to above;

FIG. 4 shows an isolated NPN transistor and other devices produced using the selective oxidation isolation technique of this invention;

FIG. 5 shows an integrated circuit containing an isolated double-diffused transistor, an isolated epitaxial resistor, an isolated base resistor, and an isolated Shottkey barrier diode formed on a wafer selectively oxidized according to the techniques of this invention;

FIG. 6 shows an isolated PNP transistor formed using the selective oxidation techniques of this invention;

FIGS. 7a and 7b show a walled-emitter NPN transistor formed using the selective oxidation techniques of this invention;

FIG. 8 shows a walled-emitter NPN transistor and other devices formed using the selective oxidation techniques of this invention;

FIG. 9 shows a unique collector sink structure made possible by the structure of this invention;

DETAILED DESCRIPTION OF THE DRAWINGS

Figure 10A:
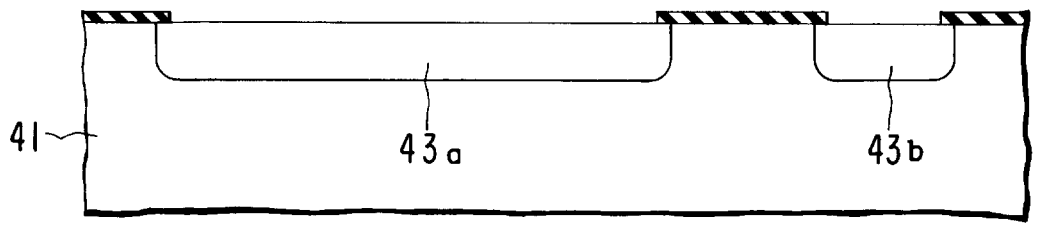
FIGS. 10a through 10e illustrate the process of this invention.

An integrated circuit structure of the prior art is shown in FIGS. 1 and 2. For clarity, oxide layers, contact windows through the oxide and lead interconnects are not shown. Wafer 10 comprises a P-type substrate 11 of semiconductor material on which is formed epitaxial layer 12 of N-type semiconductor material. A buried collector layer 13 has been formed in substrate 11 at the interface of substrate 11 and epitaxial layer 12. Isolation grid 14 of P+ type material is shown intersecting the cross-section of the device in two areas, areas 14a and 14b. Each pocket 15a, 15b and 15c of semiconductor material is of a conductivity type opposite to that of the isolation region 14 and substrate. Each pocket is electrically isolated from adjacent pockets of semiconductor material by an isolation PN junction formed around the pocket.

Pocket 15b has formed in it a heavily doped P+ type base region 16. Base region 16 in turn has formed in it N-type emitter region 17. Contact to the portion of pocket 15b of N-type epitaxial material underlying base region 16 is made through an N+ type collector sink region 18. Buried layer 13 insures that most portions of the collector region 15b can be contacted through a low resistance path, as is well known in the art, as disclosed by U.S. Pat. No. 3,260,902 to Porter.

It should be noted in FIG. 1 that the base region 16 is separated from the diffused isolation region 14 by at least the distance $d_1$, determined by masking tolerances and depletion layer thicknesses. In addition, it is desirable to separate buried N+ region 13 from the diffused isolation region 14 by a reasonable distance $d_2$. In certain instances region 13 is allowed to contact the isolation region 14 with, however, a resulting degradation in breakdown voltage and a significant increase in capacitance. Such devices thus are not suitable for high frequency operation. In addition, it is desirable to maintain the distance $d_3$ between collector sink 18 and isolation region 14. If desired, collector sink 18 can be brought into contact with isolation region 14. However, in such cases the breakdown voltage between the two regions is significantly lower and the capacitance is significantly higher than they are if the distance $d_3$ exists between these to regions.

In addition to the prior art structure shown in FIG. 1, B. T. Murphy et al, in a paper entitled "Collector Diffusion Isolated Integrated Circuits" published in Vol. 57, Proceedings of the IEEE, No. 9, pages 1523, 1527 (September 1969) disclose a transistor in which the base region is formed abutting collector sinks contacting an underlying buried collector region. Even with this structure, however, the base region must not contact the P-type region which separates the collector sinks of adjacent transistors.

In addition, it is desirable to maintain some clearance between collector sink region 18 and P+ type base region 16 to insure that the collector-base junction has a high breakdown voltage and low capacitance. If one accepts the lower breakdown voltage and higher capacitance associate with having the collector sink region 18 in intimate contact with base region 16, the clearance required between collector sink region 18 and base region 16 can be reduced or completely eliminated. However, the usual clearance kept between these two regions further increases the size of the device built using these prior art techniques. To achieve the desired separation between the sink region 18 and the base region 16, as well as between the base region 16 and the diffused isolation region 14, very stringent masking tolerances must be maintained. Not only does the mask have to be precisely cut to the exact dimension of the collector sink region 18, but the mask must be accurately registered on the device.

P-type resistor region 23 in pocket 15c of N-type epitaxial semiconductor material comprises either a base resistor or the emitter of a PNP transistor which has substrate 11 as its collector. A portion of pocket 15c may be a base region of this transistor, contact to which is made in a standard manner. Region 22, nested in P-type region 21, forms an emitter base diode with region 21.

Contacts 24a and 24b and the intermediate epitaxial material form an epitaxial resistor. The dimensions of this epitaxial resistor are defined by isolation regions (not shown) similar to region 14 and by the spacing between contacts 24a and 24b.

A typical prior art processing sequence for forming isolated pockets of semiconductor material containing NPN transistors is as follows:

1. Oxidize P-type substrate;
2. Mask and diffuse N+ buried collector;
3. Strip oxide and grow N-type epitaxial silicon layer;
4. Oxidize surface of epitaxial layer;
5. Mask, diffuse and oxidize isolation regions;
6. Mask, diffuse and oxidize base regions;
7. Mask, diffuse and oxidize emitter and collector sink regions;
8. Mask areas for metal-silicon contacts;
9. Deposit and mask metal interconnections.

The above process has six masking steps. Each masking step except the last involves the opening of windows in the layer of oxide covering the wafer being processed. The remaining oxide serves as a barrier to the diffusion of dopant atoms into the semiconductor wafer.

FIG. 2 shows in top view the relationship of collector sink 18 to the emitter region 17 and the base region 16 shown in cross-sectional view in FIG. 1 as formed in semiconductor pocket 15b. The closed shape of diffused isolation region 14 surrounding pocket 15b is shown in FIG. 2.

Base region 16 is necessarily separated from isolation region 14. This separation is necessary for electrical isolation of these two regions.

FIGS. 3a through 3d show the technique used by Appels et al in the above-cited reference to form a discrete transistor. Over an N-type substrate 31 (FIG. 3a) is deposited silicon nitride layer 33. In some cases, Appels et al use a thin layer 33a of an oxide of the semiconductor material deposited between substrate 31 and silicon nitride layer 33. A layer 34 of an oxide of the semiconductor material is deposited on nitride layer 33.

Next, windows are formed in oxide layer 34 in the locations shown by the dashed lines 34a and 34b (FIG. 3a). The nitride exposed through these windows is etched away. The etchant used for silicon nitride (typically phosphoric acid) has little effect on the oxide layers. When the nitride beneath the windows has been removed, a new etchant (such as buffered HF) which removes the oxide is used. This etchant has little effect on nitride and thus the remaining portions of nitride layer 33 (FIG. 3b) mask the underlying oxide 33a, if any, and the silicon. The portions 35a and 35b of substrate 31 exposed by windows 34a and 34b through oxide layer 33a (if any) and nitride layer 33, are etched away to a selected depth to form shallow grooves.

The wafer is then thermally oxidized (FIG. 3c). No oxide will grow on the surface of substrate 31 beneath the remaining nitride 33. However, in those portions 35a and 35b of wafer 30 where nitride has been removed oxide will grow in the semiconductor material. This local oxidation of silicon, called LOCOS by Appels et al, fills the grooves 35a and 35b with an oxide of the semiconductor material.

Studies cited by Appels et al show that the silicon oxidizes at a much faster rate than does the silicon nitride. Thus, the structure shown in FIG. 3c, with grooves 35a and 35b filled with silicon oxide, is obtained by placing wafer 30 in an oxidizing environment. The oxidized top portion of nitride layer 33 has been removed from the wafer shown in FIG. 3c.

After oxidized regions 35a and 35b have been formed, nitride 33 is removed by a nitride etch, as shown in FIG. 3d. Then, oxide 33a (if any) is stripped from substrate 31, and a P-type impurity is diffused into region 36 of substrate 31. Oxide regions 35a and 35b mask the P-type impurity and thus restrict the lateral extent of PN junction 36a to that region of substrate 31 between oxidized regions 35a and 35b.

Oxide layer 37 (FIG. 3d) is then reformed on the surface of substrate 31 and a window 38a is formed in this oxide layer. Then an N-type impurity is diffused through this window to form an N-type emitter region 38 in P-type base region 36. Thus Appels et al essentially disclose a technique of obtaining a flat base-collector junction. Because this junction is flat, its breakdown voltage is higher than the breakdown voltage commonly associated with a typical dish-shaped base-collector junction. The emitter-base junction, however, is dish-shaped as shown.

FIG. 4 shows the structure of this invention wherein oxide isolation techniques are novelly applied to a silicon epitaxial structure having a PN isolation junction to subdivide the epitaxial silicon layer into fully isolated pockets. In this specification when a pocket of semiconductor material is described as isolated by an annular-shaped isolation region of oxidized semiconductor material, it shall be understood that in the simplest case a PN isolation junction underlies the pocket of semiconductor material and intersects the isolation region of oxidized semiconductor material so that the line of intersection forms a closed path. This definition also covers the structure which results when a buried collector layer extends in the substrate from one pocket to another pocket so as to intentionally connect regions in pockets which would otherwise be electrically isolated. In this case the term "isolated pocket of semiconductor material" shall be defined to include all pockets of semiconductor material electrically connected by the buried layer. In this case from one to many closed paths of intersection between the oxidized semiconductor material and PN isolation junctions may occur in isolating the interconnected semiconductor material from other pockets of semiconductor material. The term "annular" will be used to mean any closed path of any shape, whether uniform or nonuniform in width. Thus the term "annular-shaped isolation region" is used in this specification to include all possible shapes of oxidized isolation regions which completely define the lateral limits of one pocket of semiconductor material.

The process of this invention yields a structure in which a significant portion of the epitaxial silicon layer is oxidized through to a PN isolation junction. Each annular-shaped isolation region includes all the oxidized silicon adjacent to a pocket of isolated epitaxial silicon. A given region of oxidized silicon can serve as part of the annular-shaped oxidized isolation region of more than one isolated pocket of silicon.

Wafer 40 comprises a P-type silicon substrate 41 in which are diffused N+ regions 43a and 43b. Region 43a serves as a buried collector, and a cross-under beneath the oxidized isolation region 44b of this invention. Formed on the top surface of substrate 41 is P-type silicon epitaxial layer 42. Formed in grooves etched in epitaxial layer 42 are oxide isolation regions 44a, 44b, 44c, and 44d. These oxidized isolation regions are formed by first covering the surface of epitaxial layer 42 with a nitride layer, typically silicon nitride, and then removing the nitride over those portions of epitaxial layer 42 in which the grooves are to be formed. The grooves are formed and then oxidized to define the isolation regions.

While one embodiment of this invention uses a silicon nitride layer to make those portions of the epitaxial semiconductor material in which grooves are not to be formed, any insulation layer which masks against thermal oxidization of the underlying semiconductor material and which has an etch rate significantly slower than that of the oxide of the semiconductor material and of the semiconductor material can be used in place of silicon nitride.

Epitaxial layer 42 is a true thin film being less than 5 microns thick and typically about 1.25 microns thick. Practical limitations on the thicknesses of adherent oxide limit the thickness of the oxide formed from the silicon to less than three microns. Thicker oxides crack and peel. A practical limit on the thinness of epitaxial silicon layer 42 is the minimum thickness below which transistor action is no longer obtained. When epitaxial layer 42 is 1.25 microns thick, the grooves are etched approximately 7,000 angstroms into layer 42. Then the etched grooves are oxidized. The resulting silicon oxide extends both above and below the initial exposed surface of each groove. For a 1.25 micron epitaxial layer, normally about 1.2 microns of oxide is grown. Oxide extends about 1,500 angstroms past the underlying PN isolation junction. When epitaxial silicon layer 42 is another thickness, the groove depth is appropriately selected so that the oxide extends past the PN isolation junction, contrary to the teachings of the prior art.

Next, nitride is removed from epitaxial layer 42. (In some variations of the process of this invention, a P-type base contact diffusion through window 48b to a depth shown by line 45d, is incorporated into the process at this point.) Then, the surface of epitaxial silicon layer 42 is oxidized. Oxide is removed from over region 45a. N-type impurities are then diffused into region 45a to form a collector sink which extends to buried collector layer 43a. The lateral extent of sink 45a is defined by an annular oxidized region of which sections 44a and 44b are shown in cross-section in FIG. 4. In some circumstances the sequence is reversed to allow the diffusion of the collector sink region 45a before the base-contact diffusion.

N-type impurities are next diffused into region 45b of P-type epitaxial layer 42 through window 48a in oxide 46 to form emitter region 47. Thus, buried collector 43a, epitaxial base 45b and diffused emitter 47 form an NPN transistor. The base 45b of this transistor is completely isolated from adjacent regions of epitaxial layer 42 by an annular oxidized isolation region shown in section as 44b and 44c, extending to or beneath the PN isolation junction. Regions 45a and 45b together with buried layer 43a form one isolated pocket isolated by annular-shaped oxidized isolation regions of which sections 44a and 44c are shown, and a PN isolation junction comprising the PN junction between buried layer 43a and substrate 41. Window 48b, cut through oxide 46, allows contact to be made to epitaxial base 45b.

In section 45c of epitaxial layer 42 is shown a resistor. This resistor can be either a base resistor or an epitaxial resistor depending on whether an added base layer diffusion (as indicated by line 45e) is employed in this area or not. This resistor is covered by oxide layer 49 through which windows can be cut for contact to the resistor. Material 45c is electrically isolated from substrate 41 by N+ region 43b and isolated laterally by an annular oxidized isolation region (sections 44c and 44d).

Region 45c may be connected through the PN diode formed by region 45c and buried layer 43b to another buried layer in the same substrate 41 by a cross-under, similar to cross-under 43a, which extends a oxidized isolation region 44b, 44c.

A lead interconnection pattern is then formed on the surface of the wafer to interconnect selected active and passive components into the desired circuit. The leads are typically metal such as aluminum, although conductive semiconductor material or other conductive material can also be used.

Figure 10B:
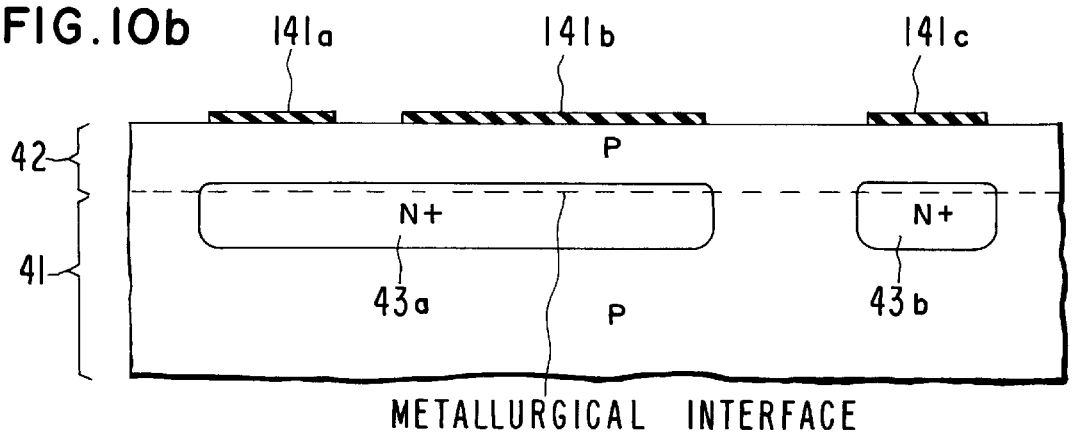
Figure 10C:
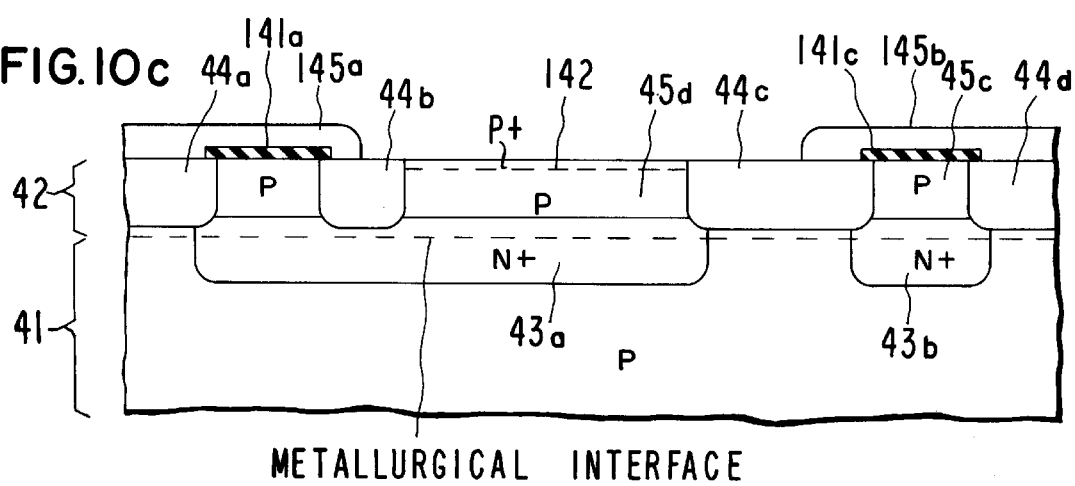

Thus, to make the structure shown in FIG. 4, a typical processing sequence is summarized as follows:

1. Oxidize P substrate.
2. Mask and diffuse N-type regions which serve as buried collectors, cross-unders and isolation regions (FIG. 10a, regions 43a, 43b).
3. Strip oxide and grow a thin P-type epitaxial silicon layer (FIG. 10b, layer 42).
4. Deposit and mask a silicon nitride layer (FIG. 10b, layers 141a, 141b, 141c).
5. Etch and oxidize isolation regions (FIG. 10c, regions 44a, 44b, 44c, 44d).
6. Remove nitride, either partially or completely according to the following rules:
    a. When no base contact predeposition is made, and when no epitaxial resistors are to be formed in the epitaxial material, completely remove the nitride without a masking step (FIG. 10c, layer 141b).
    b. Where epitaxial resistors, channel regions for MOS devices, or high $h_{fe}$ transistors are to be made, leave the nitride as mask against diffusion, (FIG. 10c, layers 141a, 141c), remove nitride from other regions.

7. Perform base contact predeposition and diffusion if desired (FIG. 10c, region 142) masking with photoresist 145a and 145b.
8. Remove the remaining nitride, if any, and oxidize the wafer (FIG. 10d, layers 143, 46, 49).
9. Mask (FIG. 10d, remove layer 143) diffuse collector sinks (FIG. 10d, region 45a) and reoxidize, if desired (FIG. 10d, replace layer 143).
10. Mask (FIG. 10d, cut window 48a in oxide layer 46) and diffuse the emitters (FIG. 10d, region 47).
11. Mask contact cuts (FIG. 10e, contact windows 48a, 48b, and removal of layer 143).
12. Deposit metal interconnect layer, mask interconnect pattern (FIG. 10e, metal 144a, 144b and 144c) and alloy. A total of six or seven masking steps are required.

In the two cases where there is no masking step associated with the removal of nitride under step 6a, the process of this invention eliminates one masking step compared to those common processes which include a separate collector sink mask and diffusion.

As indicated in FIG. 4 this process provides:

1. NPN transistors (regions 43a, 45b, 47)
2. Diodes (regions 45b, 47 and 43a, 45b)
3. Epitaxial resistors (~5 kΩ/square) (region 45c)
4. Base resistors (~600 Ω/square) (region 45b and 45c with base contact predeposition)
5. Buried collector cross-unders under isolation (region 43a).

Step 6 above, the base mask step, demonstrates the advantage of oxide isolation of the invention. Masking the base involves the removal of nitride. The nitride may be removed with very little etching of the oxide isolation so that an oversize base mask (see photoresist 145a and 145b in FIG. 10c) may be used. The actual dimensions of the base region are then defined by the isolation regions 44b, 44c. This mask may be eliminated entirely if a sheet base diffusion is used.

Figure 10D:
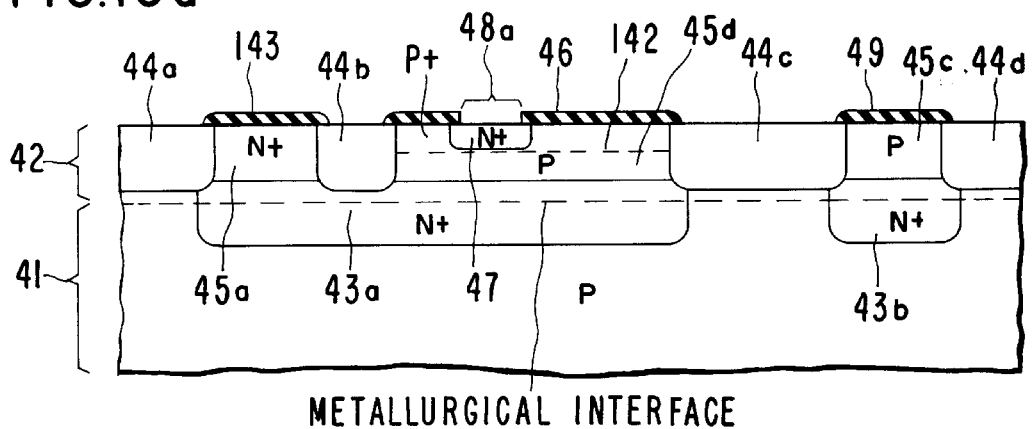
Figure 10E:
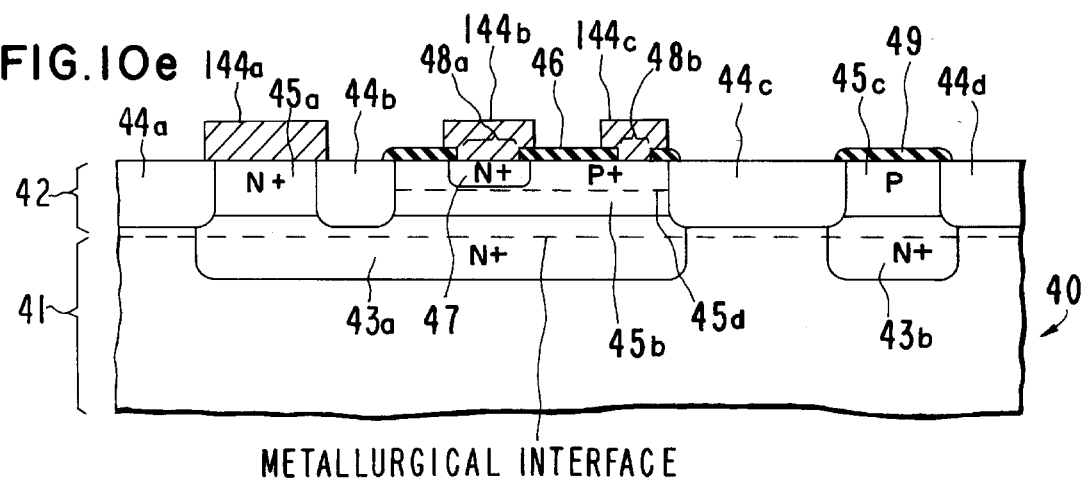

Similarly, regions covered with a thin oxide, such as collector sink region 45a, FIG. 10d, can be etched through an oversized mask without a detrimental effect on the adjacent oxide isolation. The collector sink 45a contacts the buried collector 43a beneath the P-type epitaxial silicon layer. A separate masking step is used to expose the surface of the collector sink 45a. The boundaries of the sink are defined by the oxide isolation 44a, 44b so that the sink is pre-aligned to the base 45b, the oxidized isolation region 44a, 44b, and the buried collector 43a. Collector sink 45a can be formed either before or after base region 45b is formed.

Step 8 above, removal of nitride and oxidation, places an oxide protective covering over areas which should not receive sink or emitter diffusions. Buried collector resistors are formed in the normal fashion. Base resistors and epitaxial resistors can be defined by the boundaries of the oxide isolation and the Ω/square is controlled by controlling the dopant concentration and the depth of the base diffusion and the epi resistivity.

The emitter regions, contacts, metallization and metal delineation are completed in the usual manner.

Unexpected advantages over the prior art accrue from the process and structure of this invention. First, the oxidized isolation regions define the lateral extents of the collector sinks, transistor base regions, and epitaxial and base resistors, thereby in some cases reducing the total number of masking steps required to produce an integrated circuit.

Second, the intimate contact of the base resistor, and the collector sink regions to the oxidized silicon results in a much higher packing density. With prior art diffused isolation techniques, this was not possible because the isolation regions were conductive and undesired short circuits would then exist between the base and resistor regions on the one hand, and the conductive isolation region on the other hand. Since this invention uses insulating oxide for part of the isolation, the base can extend to the isolation region with no danger of breakdown or a short circuit between the base region and the isolation region. Likewise for the same reasons, the emitter can also be formed directly abutting the oxide isolation.

Third, use of thinner epitaxial layers than common in the prior art reduces consumption of surface area by lateral movement of the isolation during its formation. The oxidization of the semiconductor layer is essentially completed when the oxidization reaches the laterally extending PN isolation junction. Packing densities can be higher with thin epitaxial layers than with thick epitaxial layers because less surface area is consumed by lateral expansion of the isolation. This lateral expansion is about twice the depth of the isolation which in turn is about equal to the thickness of the epitaxial silicon layer.

Fourth, the invented structure reduces the capacitance and increases the breakdown voltage to sidewall (i.e. the vertical pocket wall).

Fifth, another advantage is that defects in masks and masking processes, such as tears and pinholes, have less effect on the resulting circuit. For example, defects in the isolation mask in the prior art result in the formation of undesired fused isolation areas where the pinholes or other defects are located. In this invention, however, these defects merely result in the formation of additional oxide. Defects in other masks have a high probability of falling over oxidized isolation regions of semiconductor material where they have no significant detrimental effect on the resulting circuit. For example, defects in the base diffusion mask which connect the base to the isolation regions have no effect on the performance of the circuit. Similarly, defects in contact masks have little or no effect because a spurious partial penetration of metal into an oxidized isolation region of the device has no effect on device performance. A defect in an emitter mask, which in prior art devices can short an emitter region to a collector region, has no effect on the device of this invention. Finally, defects connecting the emitter region to an isolation region have little or no effect on the performance of the invented device.

FIG. 5 shows the oxidized isolation technique of this invention used to form an integrated circuit containing double-diffused transistors. Wafer 50 comprises P-type substrate 51 having a surface N-type silicon epitaxial layer 52. Formed in the top surface of substrate 51 adjacent the interface of this substrate with epitaxial layer 52 is N+ buried collector region 53a. Contained in epitaxial layer 52 are oxidized regions shown by cross-sections 54a, 54b, 54c, 54d, 54e, and 54f. The top surfaces of oxidized regions 54 are approximately in the same plane as the top surface of epitaxial layer 52. N+ type collector sink 56a formed in epitaxial layer 52 contacts N+ buried collector layer 53a through N-type epitaxial material 55a. Sink 56a can be formed simultaneously with emitter region 57a. Collector sink 56a is separated from adjacent regions of epitaxial layer 52 by an annular isolation region of oxidized silicon of which cross-sections 54a and 54b are shown. N+ buried collector layer 53a crosses under a portion of oxidized region 54b and contacts N-type epitaxial material 55b.

Region 55b serves as the collector of a transistor. Just above region 55b and separated therefrom by a substantially plane PN junction 55f is P+ type base region 56b, formed by a standard diffusion process. During the base diffusion the oxidized annular region including sections 54b and 54c defines the lateral extent of the base.

Annular isolation regions 54 allow masks to be placed on the wafer with less accuracy than would otherwise be the case. This is so since even though some of the remaining portions of epitaxial material 52 must be masked to prevent impurity diffusion, oxidized regions 54 limit the lateral extent of the base diffusion. Thus, the tolerances on the masking to form base 56b are relaxed compared to prior art techniques and yet base region 56b is formed very accurately.

After the base region 56b is formed, oxide 58 is formed over the surfaces of epitaxial semiconductor material 52 and a window 59a is cut through this oxide 58. An N-type dopant is diffused through window 59a to form emitter region 57a of the transistor. Thus, between oxidized regions 54b and 54c is formed an NPN double-diffused, oxide-isolated transistor. Base contact to this transistor, made through window 59b in oxide 58, can be permitted to overlap the adjacent oxidized isolation region 54c.

In region 55c of epitaxial layer 52 is formed an epitaxial resistor. Contact to this resistor is made through highly-doped N-type regions 57b and 57c formed in openings in oxide 58. Resistor 55c is isolated from adjacent regions of the integrated circuit by an annular oxidized region 54c, 54d. Alternatively, this resistor can be contacted by one or more highly conductive cross-unders similar to N+ region 53a.

A base resistor is formed in region 55d of epitaxial layer 52. A P-type impurity is diffused into N-type epitaxial region 55d to form P-type region 56d. Contact to this base resistor is made through windows 57d and 57e opened on both sides of oxide 58 about P-type semiconductor material 56d. This resistor is called a base resistor in view of the fact that the conductivity type and dopant level of the resistor are substantially the same as those of the base region 56b of the NPN transistor formed in section 55b of epitaxial layer 52. Sections 54d and 54e are part of an annular oxidized isolation region surrounding layers 55d and 56d to isolate these layers from the remainder of epitaxial layer 52. An N+ buried layer 53b, shown in dashed lines, may, if desired, be placed beneath material 55d and in contact with the surrounding oxidized isolation region 54d, 54e to increase the breakdown voltage of this resistor to substrate 51.

Shown attached to the top surface of region 55e of epitaxial material is metal layer 59c. Layer 59c forms a Schottky-barrier diode with the underlying epitaxial material. This diode is isolated from adjacent regions of epitaxial layer 52 by annular region 54e, 54f surrounding N-type epitaxial material 55e. An N+ buried layer 53c (shown in dashed lines) may also be placed under this diode to increase the device breakdown voltage and decrease series resistance.

The N-type epitaxial layer can be used to form N-type epitaxial resistors as shown by region 55c in FIG. 5. These resistors can be used as collector resistors without a special metal connection from resistor to collector.

FIG. 6 shows a PNP transistor formed using the oxide isolation technique of this invention. Wafer 60 comprises a P-type silicon substrate 61 which serves as the collector of the PNP transistor. Formed in P-type substrate 61 is N+ buried layer 63. Layer 63 extends beneath oxidized isolation region 64b formed in N-type epitaxial silicon layer 62. Epitaxial layer 62 overlies the top surface of substrate 61. N+ region 63 connects N-epitaxial material 65a, surrounded by annular shaped oxidized isolation region 64a, 64b with N-type epitaxial region 65b surrounded by annular-shaped oxidized isolation region 64b, 64c. N-type base region 65b is contacted through region 66a of N+ type material, N epitaxial region 65a and N+ buried layer 63. A P-type impurity is diffused into region 66b to form the emitter of the PNP transistor. The emitter-base junction between regions 66b and 65b is substantially flat.

Because the emitter region 66b occupies the complete surface area surrounded by one annular oxidized isolation region 64b, 64c, the masking tolerances on the formation of the emitter region are less critical than with prior art devices of the same size.

In the structure of FIGS. 5 and 6, it should be noted that epitaxial layers 52 and 62 are N-type rather than P-type. This means no buried layer is necessary under resistors and the collector sink diffusion can be replaced by a shallower emitter diffusion and masked by the emitter-masking step. The base is formed by the base diffusion and the epitaxial layer now acts as the collector of the NPN transistor (FIG. 5).

The N-type epitaxial layer is also useful for fabrication of substrate PNP transistors in which the P-type base of an NPN transistor forms the emitter of a PNP transistor. The N-type epitaxial layer forms the PNP base and the P-type substrate acts as the collector of the PNP transistor. With this arrangement, the transistor shown in FIG. 5 has buried layer 53a reduced to a size such as shown by dashed line 56e. This device is called a substrate controlled switching transistor or SCST.

FIGS. 7a and 7b show a structure in which the layout of the collector, the emitter and the base has been changed, thus affecting the emitter-isolation spacing. The processes used above to fabricate the structure shown in either FIG. 4 or in FIGS. 5 and 6 can be used. The structure shown in FIGS. 7a and 7b is called the walled-emitter transistor because the emitter is allowed to contact the oxide isolation. As shown in FIG. 7a wafer 70 comprises a P-type silicon substrate 71 in which is diffused an N+ buried collector layer 73. N-type epitaxial layer 72 is grown on the top surface of substrate 71 (this layer could also be P-type). Oxidized isolation regions 74a, 74b and 74c are formed in epitaxial layer 72 using the techniques described above. A collector contact region 75a is formed in epitaxial layer 72 and is surrounded by an annular oxidized isolation region 74a, 74b. In region 76 of epitaxial layer 72, an impurity is diffused to form a P+ type base region 75c. The PN junction 74f between P+ base region 75c and the epitaxial region 76 is approximately flat and extends to an annular-isolation region, 74b, 74c. Next, an oxide layer 77 is formed on the top surface of epitaxial layer 72 and a window 77a is formed in this oxide layer. Through window 77a an N-type impurity is diffused to form emitter region 75b. Contact to base region 75c is made through window 77b in oxide 77. Emitter region 75b abuts against a part of oxidized isolation region 74b. The top view of the circuit shown in FIG. 7b illustrates the positions of the collector, base and emitter contacts and the oxidized isolation regions. The collector, base and emitter contacts each can extend over the adjacent oxidized isolation regions thereby significantly decreasing the difficulty of aligning the contact mask.

In forming the transistor shown in FIG. 7a, care must be taken that the impurity concentration in region 75d of base region 75c is sufficiently high to prevent unwanted inversion, depletion, or channel formation, particularly adjacent oxide region 74b.

FIG. 8 shows another walled-emitter NPN transistor constructed using the oxidized isolation regions of this invention. Wafer 80 comprises P-type silicon substrate 81 on which is formed N-type silicon epitaxial layer 82. Formed in substrate 81 is N+ type buried collector region 83. Oxidized isolation regions 84a through 84d extend to or through the isolation PN junction. Collector contact to collector region 85b is made through collector contact 88a attached to collector sink 87a formed in portion 85a of epitaxial layer 82. Base region 86a is diffused into underlying N-type epitaxial region 85b of epitaxial layer 82. The PN junction between the base region 86a and collector region 85b is approximately flat. Emitter region 87b is formed in one side of base region 86a adjacent the annular-shaped oxidized isolation region 84b, 84c. Contacts to the emitter region 87b and the base region 86a are made through contacts 88b and 88c overlying windows in oxide layer 89. In this case, both the emitter diffusion mask and the emitter contact metal mask, if used, can overly the adjacent isolation oxide, greatly relaxing masking tolerances. An N-type epitaxial resistor is formed in semiconductor region 85c of epitaxial layer 82, surrounded by annular-shaped oxidized isolation region 84c, 84d. Contact to this epitaxial resistor is made through metal layers 88d and 88e contacting regions of epitaxial material 85c through windows in oxide 89.

Surrounding base region 86a, collector sink 87a, and epitaxial resistor 85c, and abutting the oxidized isolation regions surrounding these regions, is a P+ guard ring of which cross-sections 86b through 86g are shown. In some structures these guard rings may extend to the isolation PN junction. These guard rings, in one embodiment, are formed by etching the surfaces of the oxidized isolation regions prior to the removal of the nitride and immediately after the oxidized isolation regions are formed, and then diffusing the P-type impurity into the thus exposed silicon. This solves the problem discussed above in connection with region 75d of base 75c shown in FIG. 7c. It should be noted that the guard ring diffusion is self-aligning with respect to the oxidized isolation region and requires no additional masking step. All the other devices disclosed in this application can also be fabricated with such a self-aligned guard ring of whatever type conductivity is appropriate and with the walled emitter structure.

Furthermore, it should be noticed that in the structure of FIG. 5, a pinhole in the isolation mask might very well result in oxidizing a portion of epitaxial layer 72 to be surrounded by an emitter region. In this situation, even if the emitter region was not to abut an oxidized isolation region, the emitter in effect abuts a portion of that oxidized isolation region formed inadvertently by the pinhole. Accordingly, in carrying out the diffusion of the P+ guard ring, as discussed above in conjunction with FIG. 8, the ring will also be diffused around this spurious portion of oxidized isolation material, thereby reducing or eliminating the effect of inversion layers, depletion regions and channeling on the performance of the device.

FIG. 9 shows a unique collector sink structure made possible by this invention. P-type silicon substrate 91 has N+ buried layer 93 formed in its top surface. Silicon epitaxial layer 92 of more highly-doped N-type material is next formed on the top surface of substrate 91. Oxidized annular regions of epitaxial silicon, of which cross-sections 94a and 94b are shown, define the lateral extent of isolated silicon pockets. Formed in pocket 96a is a collector sink 96f. To form this sink, a portion of the oxidized semiconductor material 94b adjacent this sink is etched away to expose a portion of the side of the adjacent epitaxial silicon. N-type impurities are then diffused into the exposed epitaxial semiconductor material to place a high concentration of impurities along the portion 96f of the epitaxial silicon exposed by etching away part 96e of oxidized isolation region 94b. This highly conductive semiconductor material contacts directly the underlying N-type collector 93. Cavity 96e, formed by etching away a portion of the oxidized isolation region, is limited in size such that it does not completely surround the collector sink and rather occupies only a small portion of the circumferential area of the collector sink. This allows metal contact to be made to the collector sink without having to go down into portion 96e removed by the etch and back up to the collector sink.

The five masking steps necessary to define completely the structure shown in FIG. 9 are as follows:

(1) Definition of buried collector;

(2) Definition of the isolation regions;

(3) Definition of the emitter and collector sink regions;

(4) Definition of the contact areas; and (5) Definition of the metal interconnect pattern.

Significant advantages are derived from the process and structure of this invention. One major advantage of the process is the size reduction provided by eliminating the need for clearances between the base and emitter regions and oxidized isolation regions. Using the techniques of this invention, the emitter and base regions can be formed directly abutting adjacent oxidized isolation regions.

Figure 11:
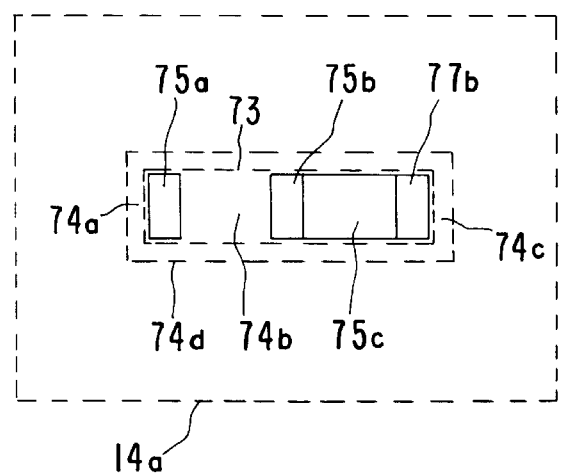
FIG. 11 illustrates the increase in packing density achieved with this invention by showing in top view the portion of the structure of FIG. 7a comparable to the structure shown in FIG. 2.

FIG. 11 illustrates the significant reduction in size of a transistor produced using the oxidized isolation techniques of this invention compared to a transistor produced using prior art diffused isolation techniques. FIG. 11 shows a top view of the transistor shown in FIGS. 7a and 7b placed within the diffused isolation region 14 surrounding the prior art transistor shown in top view in FIG. 2. Both structures are drawn to the same scale. As is apparent, the centerline 14a of the prior art diffused isolation region 14 surrounds a considerably larger area than does the centerline 74d of the oxidized isolation region surrounding the transistor shown in FIG. 7a. Shown clearly in this figure is the fact that collector contact 75a is adjacent oxidized isolation region 74a, emitter contact 75b is adjacent oxidized isolation region 74b and base contact 77b is adjacent oxidized isolation region 74c. The buried collector beneath the base emitter and collector regions is denoted by dashed line 73 shown slightly outside the base, emitter and collector contact regions. The area reduction of at least 65% per transistor obtained with this invention is apparent from this figure. A second advantage lies in the elimination of the detrimental effects of defects in the masks and masking procedures used to define the isolation regions and the diffused regions in the device.

If desired, the collector sink can be covered with an oxide layer at various times in the process. Placing oxide on the collector sink allows the collector sink to be used independently as a low resistivity cross-under beneath an overlying lead.

Different kinds of resistors may also be formed in the invented structure:

1. A buried collector under isolation, (FIG. 5, region 53a);
2. A buried collector not under isolation (FIG. 5, region 53f). This buried collector has a slightly lower resistivity than the buried collector under oxide;
3. Epitaxial resistors, using either P-type (FIG. 4, region 45c) or N-type (FIG. 5, region 55c) material;
4. A pinched epitaxial resistor which can be pinched by the emitter (FIG. 4, region 45b). Such a resistor is formed in the base region. If pinched by the base (FIG. 5, region 55b) the resistor is formed in the epitaxial material adjacent, and usually underneath, the base;
5. A base resistor of P-type (FIG. 5, region 56d) or N-type (obvious from structure with all conductivity types reversed) material;
6. Emitter resistors (made by contacting any emitter region in two places);
7. A collector sink resistor (FIG. 5, region 55a). All these resistors give additional design flexibility in working out optimum circuits.

While certain embodiments of this invention have been described, other related structures and processes will be obvious in view of this disclosure. In particular structures complimentary to those described in this specification can be obtained by reversing the conductivity type of each region in each structure.

What is claimed is:

1. The method of forming a plurality of electrically isolated pockets of semiconductor material in a semiconductor structure comprising a silicon substrate of one conductivity type with an epitaxial silicon layer of opposite conductivity type thereon, which comprises the steps of:

forming a low resistivity region of said opposite conductivity type in said substrate;

growing a doped epitaxial silicon layer on said silicon substrate, said doped epitaxial silicon layer having a conductivity type relative to the conductivity type of at least a portion of the top surface of said substrate such that a laterally-extending PN junction is formed in at least part of said semiconductor structure, said low resistivity region being situated directly beneath the surface of said substrate on which said epitaxial layer is formed;

forming a layer of insulation on said epitaxial silicon layer, said insulation having the properties that it is substantially unaffected by at least one etchant used to remove epitaxial silicon and substantially masks the diffusion of oxygen;

removing portions of said insulation overlying regions of said epitaxial silicon layer to be converted into oxidized silicon;

forming depressions to a specified depth in said epitaxial silicon exposed by removal of said insulation by removing part of said epitaxial silicon exposed by removal of said insulation;

subdividing said epitaxial silicon layer into a plurality of electrically isolated pockets of semiconductor material by oxidizing the silicon exposed by said depressions to form oxidized silicon extending through said epitaxial silicon layer to said PN junction, the depth and shape of said depressions being selected such that the oxidized silicon has an upper surface substantially coplanar with the top surface of said epitaxial silicon layer and a bottom surface which extends through said epitaxial silicon layer to said PN junction, thereby both to surround each pocket by an annular-shaped region of oxidized silicon and to electrically isolate each pocket by an annular-shaped region of oxidized silicon and a portion of said laterally-extending PN junction said low resistivity region forming at least part of one electrically isolated pocket of semiconductor material;

removing said layer of insulation after the epitaxial silicon exposed by said depressions is oxidized through to said PN junction;

introducing an impurity of said opposite conductivity type into a selected region of epitaxial silicon of said opposite conductivity type the lateral extent of which is defined by a particular annular-shaped region of oxidized silicon, a portion of said particular annular-shaped region of oxidized silicon extending through said epitaxial layer to contact said low resistivity region;

masking the surface of said epitaxial silicon layer to leave exposed the surface of another region of epitaxial silicon above said low resistivity region in said silicon substrate, said another region of epitaxial silicon being surrounded by another particular annular-shaped region of oxidized silicon, a portion of said another particular annular-shaped region of oxidized silicon extending through said epitaxial layer to contact said low resistivity region; and introducing an impurity of said one conductivity type into said another region of epitaxial silicon to a selected depth less than the thickness of said epitaxial layer.

2. The method of claim 1 including the additional steps of:

masking a portion of the surface of said another region of epitaxial silicon into which said impurity of said one conductivity type has been introduced; and introducing an impurity of said opposite conductivity type into the unmasked portion of said surface of said another region of epitaxial silicon to a depth less than said selected depth to form a second region of said opposite conductivity type.

3. The method of claim 2 wherein said step of introducing an impurity of said opposite conductivity type into said another region of epitaxial silicon comprises the step of introducing an impurity of said opposite conductivity type into said another region of epitaxial silicon so as to form a second region of said opposite conductivity type abutting at least part of said another annular-shaped region of oxidized silicon.

4. The method of forming a plurality of electrically isolated pockets of semiconductor material in a semiconductor structure comprising a silicon substrate of one conductivity type with an epitaxial silicon layer thereon of said one conductivity type which comprises the steps of:

forming directly beneath portions of the top surface of said substrate low resistivity regions of opposite conductivity type to said one conductivity type, such that a laterally-extending PN junction is formed between said low resistivity regions and said silicon substrate;

growing a doped epitaxial silicon layer of said one conductivity type on said silicon substrate;

forming a layer of insulation on the top surface of said epitaxial silicon layer, said insulation having the properties that it is substantially unaffected by at least one etchant used to remove epitaxial silicon and substantially masks the diffusion of oxygen;

removing portions of said insulation overlying regions of said epitaxial silicon layer to be converted into oxidized silicon;

forming depressions to a specified depth in said epitaxial silicon exposed by removal of said insulation by removing part of said epitaxial silicon exposed by removal of said insulation;

subdividing said epitaxial silicon layer into a plurality of electrically isolated pockets of semiconductor material by oxidizing the silicon exposed by said depressions to form oxidized silicon, said depth being selected such that the oxidized silicon has an upper surface approximately coplanar with the top surface of the remaining portions of said epitaxial layer and has a bottom surface in contact with said laterally extending PN junction thereby to surround each pocket of semiconductor material by an annular-shaped region of oxidized silicon;

removing said layer of insulation after the silicon exposed by said depressions is oxidized through to said laterally extending PN junction;

introducing an impurity of said one conductivity type into a selected region of said epitaxial silicon surrounded by an annular-shaped region of oxidized silicon to form a more highly doped region of said one conductivity type;

masking said epitaxial silicon layer to leave exposed the surface of another region of epitaxial silicon above one of said low resistivity regions in said silicon substrate, said another region of epitaxial silicon being surrounded by another annular-shaped region of oxidized silicon; and introducing an impurity of said opposite conductivity type into said another region of epitaxial silicon.

5. The method of claim 4 wherein said impurity of said opposite conductivity type is introduced through said selected region of epitaxial silicon all the way to said low resistivity region in said silicon substrate, thereby to form an electrical contact to said low resistivity region in said silicon substrate.

6. A fabrication method comprising the steps of:

creating a structure in which a doped epitaxial silicon layer is grown on a doped silicon semiconductor substrate predominantly of one conductivity type, the epitaxial layer being predominantly of opposite conductivity type to said one conductivity type such that a PN isolation junction extends laterally along at least part of the interface between the substrate and the epitaxial layer, and in which a low resistivity buried layer of said opposite conductivity type is provided along the interface between the substrate and the epitaxial layer;

forming an insulation layer over the epitaxial layer, the insulation layer being substantially impervious to the penetration of oxygen;

removing selected material of the insulation layer down to the epitaxial layer to create a pattern of one or more openings through the insulation layer;

removing epitaxial silicon exposed through each opening to form a pattern of one or more depressions extending partway through the epitaxial layer; and subdividing the epitaxial layer into a plurality of laterally separated pockets of semiconductor material by thermally oxidizing silicon exposed at each depression to form a patterned electrically insulating region of oxidized silicon extending at least partway through the epitaxial layer, the insulating region extending down to the PN isolation junction such that each pocket of semiconductor material is laterally surrounded by oxidized silicon and is electrically isolated from each other pocket by surrounding oxidized silicon and a part of the PN isolation junction, the insulating region and the isolated pockets having largely co-planar upper surfaces, the low resistivity layer having been provided at such a location that the low resistivity layer forms part of a selected one of the isolated pockets of semiconductor material, the selected pocket including first and second epitaxial silicon portions laterally separated by oxidized silicon, both epitaxial portions being contiguous with the low resistivity layer.

7. A method as in claim 6 wherein the low resistivity layer meets the first and second epitaxial portions along substantially their entire lower surfaces.

8. A method as in claim 6 including the step of introducing an impurity of said opposite conductivity type into the first epitaxial portion to form a more heavily doped contact region.

9. A method as in claim 8 including the step of introducing an impurity of said one conductivity type into the second epitaxial portion to form a device region of said one conductivity type extending from the upper surface of the second epitaxial portion downward to a depth less than that of the underlying part of the low resistivity layer.

10. A method as in claim 9 including the step of introducing an impurity of said opposite conductivity type into part of the device region of said one conductivity type to form a device region of said opposite conductivity type extending from the upper surface of the second epitaxial portion downward to a depth less than that of the device region of said one conductivity type.

11. A method as in claim 10 wherein part of the lateral periphery of the device region of said opposite conductivity type abuts oxidized silicon surrounding the second epitaxial portion.

12. A fabrication method comprising the steps of:

creating a structure in which a doped epitaxial silicon layer predominantly of one conductivity type is grown on a doped silicon substrate predominantly of said one conductivity type, laterally separated low resistivity buried layers of opposite conductivity type to said one conductivity type being provided in the structure along the interface between the substrate and the epitaxial layer so as to form a PN isolation junction between the substrate and the low resistivity layers;

forming an insulation layer over the epitaxial layer, the insulation layer being substantially impervious to the penetration of oxygen;

removing selected material of the insulation layer down to the epitaxial layer to create a pattern of one or more openings through the insulation layer;

removing epitaxial silicon exposed through each opening to form a pattern of one or more depressions extending partway through the epitaxial layer; and subdividing the epitaxial layer into a plurality of laterally separated pockets of semiconductor material by thermally oxidizing silicon exposed at each depression to form a patterned electrically insulating region of oxidized silicon extending at least partway through the epitaxial layer, the insulating region extending down to the PN isolation junction such that each pocket of semiconductor material is laterally surrounded by oxidized silicon and is electrically isolated from each other pocket by surrounding oxidized silicon and a part of the PN isolation junction, the insulating region and the isolated pockets having largely co-planar upper surfaces, a selected one of the pockets including first and second epitaxial silicon portions laterally separated by oxidized silicon, both epitaxial portions being contiguous with a specified one of the low resistivity layers.

13. A method as in claim 12 wherein the specified low resistivity layer meets the first and second epitaxial portions along substantially their entire lower surfaces.

14. A method as in claim 13 including the step of introducing an impurity of said opposite conductivity type into the first epitaxial portion to form a contact region of the opposite conductivity type extending from the upper surface of the first epitaxial portion down to the specified low resistivity layer.

15. A method as in claim 14 including the step of introducing an impurity of said opposite conductivity type into the second epitaxial portion to form a device region of said opposite conductivity type extending from the upper surface of the second epitaxial portion downward to a depth less than that of the specified low resistivity layer.

16. A method as in claim 15 wherein part of the lateral periphery of the device region of said opposite conductivity type abuts oxidized silicon surrounding the second epitaxial portion.

17. A method as in claim 15 including the step of introducing an impurity of said one conductivity type into the second epitaxial portion to form a more heavily doped contact region at a location laterally separated from the device region of said opposite conductivity type.

\* \* \* \* \*